United States Patent
Hopper et al.

(10) Patent No.: US 7,105,373 B1
(45) Date of Patent: Sep. 12, 2006

(54) VERTICAL PHOTODIODE WITH HEAVILY-DOPED REGIONS OF ALTERNATING CONDUCTIVITY TYPES

(75) Inventors: Peter J. Hopper, San Jose, CA (US); Philipp Lindorfer, San Jose, CA (US); Vladislav Vashchenko, Palo Alto, CA (US); Andy Strachan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/640,963

(22) Filed: Aug. 14, 2003

(51) Int. Cl.
*H01L 21/00* (2006.01)

(52) U.S. Cl. .............................. 438/60; 438/74; 438/75; 257/465

(58) Field of Classification Search .................. 438/60, 438/74, 75; 257/188, 189, 440, 441, 616, 257/465
See application file for complete search history.

(56) References Cited

U.S. PATENT DOCUMENTS

| | | | |
|---|---|---|---|
| 5,932,873 A | 8/1999 | Bergemont et al. | 250/208.1 |
| 5,962,844 A | 10/1999 | Merrill et al. | 250/214 A |
| 5,965,875 A | 10/1999 | Merrill | 250/226 |
| 5,970,316 A | 10/1999 | Merrill | 438/57 |
| 5,982,012 A | 11/1999 | Merrill | 257/463 |
| 6,002,432 A | 12/1999 | Merrill et al. | 348/241 |
| 6,018,365 A | 1/2000 | Merrill | 348/302 |
| 6,066,510 A | 5/2000 | Merrill | 438/57 |
| 6,088,058 A | 7/2000 | Mead et al. | 348/296 |
| 6,150,683 A | 11/2000 | Merrill et al. | 257/292 |
| 6,160,282 A | 12/2000 | Merrill | 257/292 |
| 6,211,510 B1 | 4/2001 | Merrill et al. | 250/208.1 |
| 6,246,043 B1 | 6/2001 | Merrill | 250/208.1 |
| 6,369,853 B1 | 4/2002 | Merrill et al. | 348/302 |
| 6,410,899 B1 | 6/2002 | Merrill et al. | 250/208.1 |
| 6,452,633 B1 | 9/2002 | Merrill et al. | 348/302 |
| 6,476,372 B1 | 11/2002 | Merrill et al. | 250/208.1 |
| 6,512,544 B1 | 1/2003 | Merrill et al. | 348/302 |
| 6,525,304 B1 | 2/2003 | Merrill et al. | 250/208.1 |
| 6,606,120 B1 | 8/2003 | Merrill et al. | 348/273 |
| 6,632,701 B1 | 10/2003 | Merrill | 438/70 |
| 6,636,261 B1 | 10/2003 | Pritchard et al. | 348/308 |
| 6,646,318 B1 * | 11/2003 | Hopper et al. | 257/440 |
| 6,697,114 B1 | 2/2004 | Merrill | 348/308 |
| RE38,499 E | 4/2004 | Merrill et al. | 348/301 |
| 6,727,521 B1 | 4/2004 | Merrill | 257/98 |
| 6,731,397 B1 | 5/2004 | Merrill et al. | 358/1.16 |
| 6,741,283 B1 | 5/2004 | Merrill et al. | 348/308 |
| 6,760,070 B1 | 7/2004 | Merrill et al. | 348/294 |
| 2002/0058353 A1 | 5/2002 | Merrill | 438/57 |

OTHER PUBLICATIONS

U.S. Appl. No. 10/219,836, Hopper et al.

* cited by examiner

*Primary Examiner*—Fernando L. Toledo
(74) *Attorney, Agent, or Firm*—Mark C. Pickering

(57) ABSTRACT

A single junction interdigitated photodiode utilizes a stack of alternating highly doped first regions of a first conductivity type and highly doped second regions of a second conductivity type, which are formed below and contact the first regions, to collect photons. In addition, a highly doped sinker of a first conductivity type contacts each first region, and a highly doped sinker of a second conductivity type contacts each second region.

24 Claims, 4 Drawing Sheets

VERTICAL PHOTODIODE WITH HEAVILY-DOPED REGIONS OF ALTERNATING CONDUCTIVITY TYPES

DETAILED DESCRIPTION OF THE INVENTION

Figure 1:
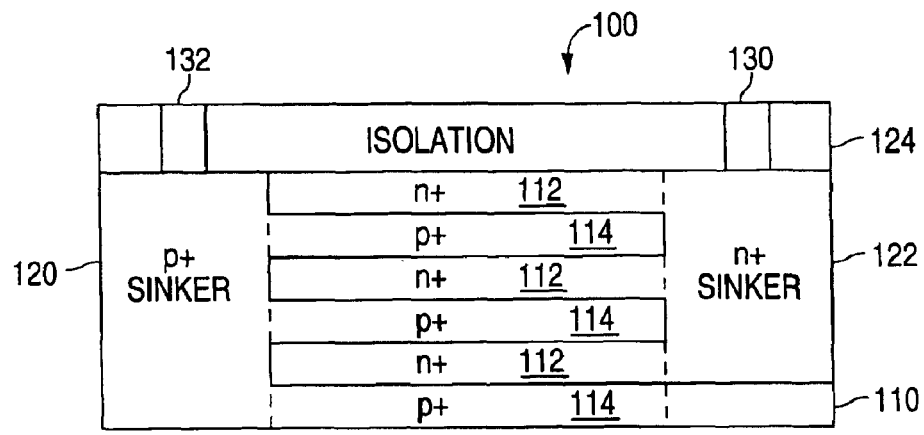
FIG. 1 is a cross-sectional diagram illustrating an example of an interdigitated photodiode 100 in accordance with the present invention.

FIG. 1 shows a cross-sectional diagram that illustrates an example of an interdigitated photodiode 100 in accordance with the present invention. As shown in FIG. 1, photodiode 100, which is formed in a semiconductor material 110, such as an epitaxial layer, includes a number of n+ regions 112 that are formed in semiconductor material 110. The n+ regions 112 are vertically stacked and spaced apart from each other, and have substantially uniform dopant concentrations.

As further shown in the FIG. 1 example, photodiode 100 also includes a number of p+ regions 114 that are formed in semiconductor material 110. The p+ regions 114 are vertically stacked and spaced apart from each other, and have substantially uniform dopant concentrations.

The n+ regions 112 and the p+ regions 114 vertically alternate and contact each other such that each p+ region 114, except for the bottom p+ region 114, lies between and contacts an upper n+ region 112 and a lower n+ region 112. The bottom p+ region 114, In turn, contacts an upper n+ region 112.

The thicknesses of the n+ regions 112 and p+ regions 114 are selected to minimize the likelihood that the charge carriers from photogenerated electron-hole pairs will recombine. Further, the total thickness of photodiode 100, which is equal to the total number of n+ regions 112 and p+ regions 114 that are utilized, is selected based on the wavelengths of the photons that are to be collected during the operation of photodiode 100.

In addition to n+ and p+ regions 112 and 114, photodiode 110 also includes a p+ sinker 120 and an n+ sinker 122. P+ sinker 120 and n+ sinker 122 have substantially uniform dopant concentrations. Further, p+ sinker 120 is formed in semiconductor material 110 so that p+ sinker 120 contacts each p+ region 114, while n+ sinker 122 is formed in semiconductor material 110, spaced apart from p+ sinker 120, so that n+ sinker 122 contacts each n+ region 112. As a result, n+ regions 112/n+ sinker 122 and p+ regions 114/p+ sinker 120 form a single interdigitated p-n junction.

Further, photodiode 110 includes a layer of isolation material 124 that is formed over the top n+ region 112, a first metal contact 130 that is formed through isolation material 124 to make an electrical connection with n+ sinker 122, and a second metal contact 132 that is formed through isolation material 124 to make an electrical connection with p+ sinker 120.

In operation, a single imaging cycle includes a reset period, an integration period, and a read out period. During the reset period, photodiode 100 is reset by applying a positive reset voltage to the n+ regions 112 via metal contact 130 and n+ sinker 122, while p+ regions 114 are connected to ground via metal contact 132 and p+ sinker 120.

The positive reset voltage reverse biases the interdigitated p-n junction (without breaking down the p-n junction), and sets up an electric field that attracts all or substantially all of the free electrons from the p+ regions 114 to the n+ regions 112 and n+ sinker 122 where the electrons are collected. As a result, the p+ regions 114 are depleted or substantially depleted of electrons.

At the end of the reset period, the positive reset voltage is removed. When the positive reset pulse is removed, a positive charge remains on the n+ regions 112 and n+ sinker 122 as there is no discharge path for the positive charge to follow. As a result, the electric field remains after the reset voltage has been removed.

As noted above, an integration period follows the reset period. During the integration period, photodiode 100 collects the photons that strike photodiode 100. When a photon strikes photodiode 100, the photon penetrates a distance into semiconductor material 110, depending on the wavelength of the photon, where the energy of the photon creates an electron-hole pair.

For example, blue photons (from blue light) tend to form electron-hole pairs in a blue region near the surface, whereas red photons (from red light) tend to form electron-hole pairs in a red region that is much deeper in semiconductor material 110. Green photons (from green light), on the other hand, form electron-hole pairs in a green region that lies between the blue and red regions, while infra-red (IR) light forms electron-hole pairs in an IR region that lies below the red region.

When electron-hole pairs are formed in the p+ regions 114, the holes diffuse over to p+ sinker 120 where they are collected by the ground connection to second metal contact 132. The electrons, on the other hand, diffuse over to the n+ regions 112 and n+ sinker 122, where the electrons reduce the magnitude of the positive charge that was left on the n+ regions 112 and n+ sinker 122 when the reset voltage was removed.

When electron-hole pairs are formed in the n+ regions 112, the holes diffuse over to the p+ regions 114 and p+ sinker 120 and on to metal contact 132. At the same time, the electrons formed in the n+ regions 112 reduce the magnitude of the positive charge that was left on the n+ regions 112 and n+ sinker 122.

Thus, at the end of the integration period (a predetermined period of time), the magnitude of the positive charge on the n+ regions 112 and n+ sinker 122 that was present after the reset voltage was removed has been reduced by the number of photons that were collected during the integration period.

Following the integration period, during the read out period, the magnitude of the positive charge that is left on the n+ regions 112 and n+ sinker 122 is sensed by a sensing circuit, such as an active pixel sensor cell or a charge coupled device (CCD). Thus, based on the change in positive charge over the integration period, the number of photons received by photodiode 100 can be determined.

One of the advantages of the present invention is that photodiode 100 utilizes a number of highly doped n-type and p-type regions 112 and 114, which are sized to minimize recombination, to form the interdigitated junction. The highly doped n-type and p-type regions provide a relatively low resistance path for the photogenerated carriers to follow.

In addition, the highly doped n-type and p-type regions 112 and 114 allow a relatively large reset voltage to be used. A relatively large reset voltage, in turn, generates a relatively strong electric field. Thus, once the reset voltage has been removed, a relatively strong electric field remains.

By providing a low resistance path and a strong electric field, the present invention allows photogenerated carriers to be quickly extracted from the interdigitated p-n junction. Thus, although photodiode 100 has a large overall capacitance, a low resistance path and a strong electric field provide for relatively short photocarrier transit times which, in turn, provide fast performance.

Another advantage of the present invention is that the total thickness of photodiode 100 can be made to be relatively large, e.g., five microns, by utilizing a larger number of n+ and p+ regions 112 and 114. By forming photodiode 100 to be relatively thick, photodiode 110 is more sensitive to visible light towards the red end of the spectrum as well as IR light. Thus, the present invention provides a photodiode that is both fast and sensitive to red and IR wavelengths.

Figure 2A:
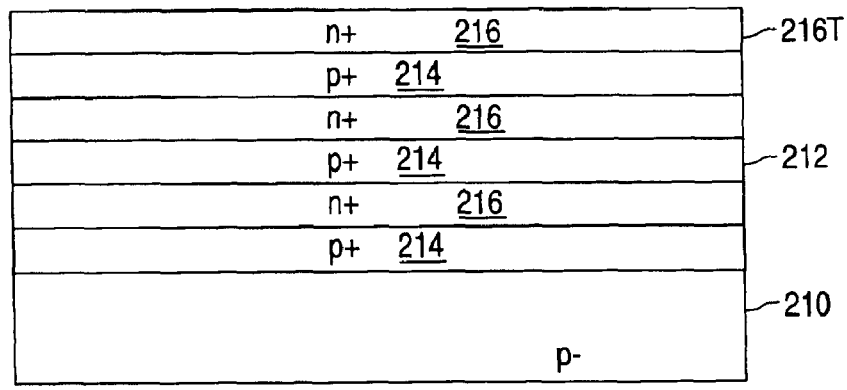
FIGS. 2A–2C are a series of cross-sectional views illustrating an example of a method of forming a photodiode in accordance with the present invention.
Figure 2B:
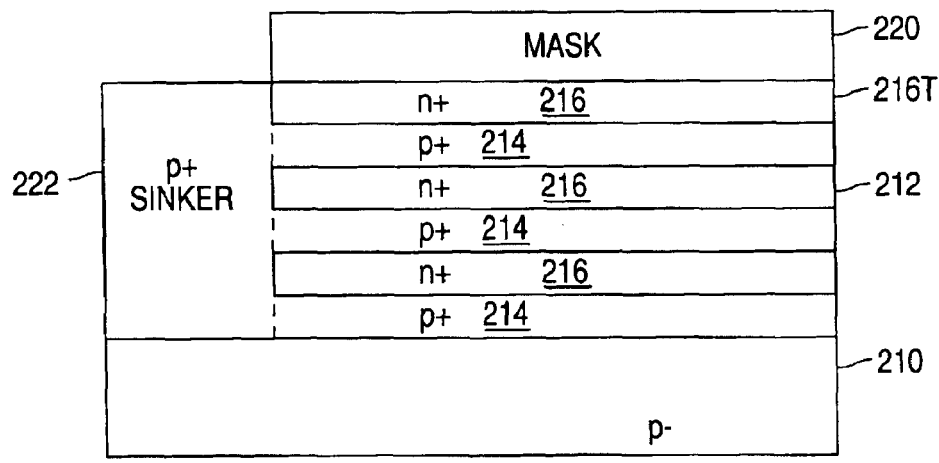
Figure 2C:
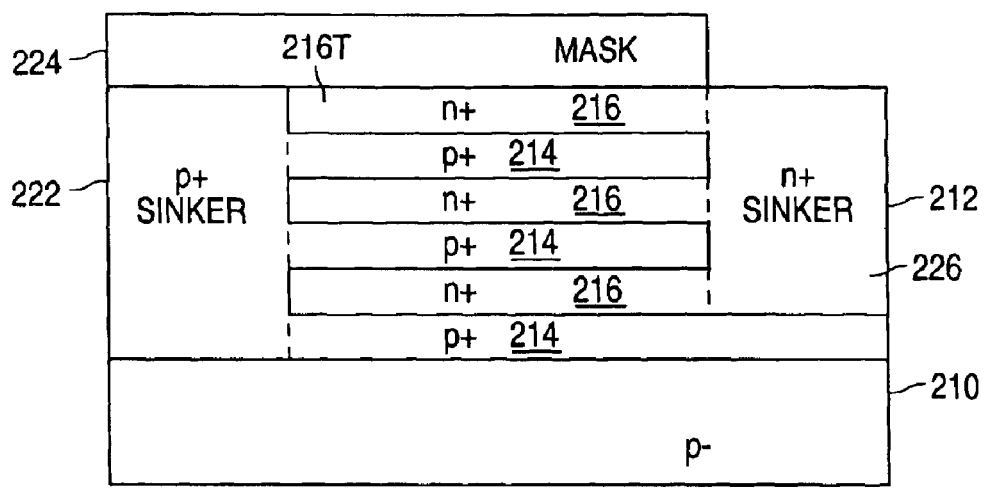

FIGS. 2A–2C show a series of cross-sectional views that illustrate an example of a method of forming a photodiode in accordance with the present invention. As shown in FIG. 2A, the method utilizes a conventionally formed semiconductor material 210, such as p-single crystal silicon, and begins by growing an epitaxial layer 212 on semiconductor material 210.

As further shown in FIG. 2A, epitaxial layer 212 includes alternating p+ and n+ regions 214 and 216, respectively, that have substantially uniform dopant concentrations and include a top n+ region 216T. The alternating p+ and n+ regions 214 and 216, in turn, are formed by alternately introducing a p-type impurity dopant and an n-type impurity dopant during the formation of epitaxial layer 212.

For example, a first gas that includes boron can be introduced during the epitaxial growth for a first predetermined time to form a p+ region 214. The first gas is removed after the first predetermined time, and followed by the introduction of a second gas that includes, for example, phosphorous. The second gas is present during the epitaxial growth for a second predetermined time to form an n+ region 216. Thus, by altering the gas that is introduced during the epitaxial growth, the p+ and n+ regions 214 and 216 can be formed.

Next, as shown in FIG. 2B, a first mask 220 is formed and patterned over top n+ region 216T to expose a first region on the surface of top n+ region 216T. Following this, boron is implanted to form a p+ sinker 222 such that p+ sinker 222 contacts each p+ region 214. P+ sinker 222 has a substantially uniform dopant concentration, and can be formed using multiple implants with different implant energies. After the implant, first mask 220 is removed.

Following this, as shown in FIG. 2C, a second mask 224 is formed and patterned over top n+ region 216T to expose a second region on the surface of top n+ region 216T. Following this, an n-type material is implanted to form an n+ sinker 226 such that n+ sinker 226 contacts each n+ region 216. N+ sinker 226 has a substantially uniform dopant concentration, and can be formed using multiple implants with different implant energies. (The order of forming the p+ and n+ sinkers can be reversed.) After the implant, second mask 224 is removed and the method continues with conventional steps.

Figure 3A:
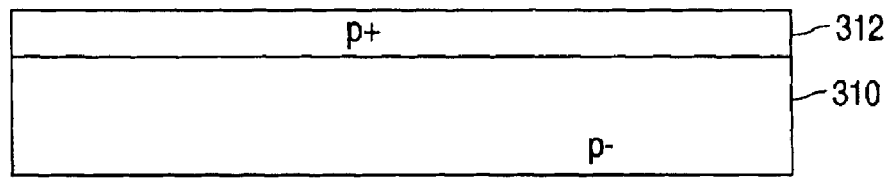
FIGS. 3A–3B are a series of cross-sectional views illustrating an example of a method of forming a photodiode in accordance with a first alternate embodiment of the present invention.
Figure 3B:
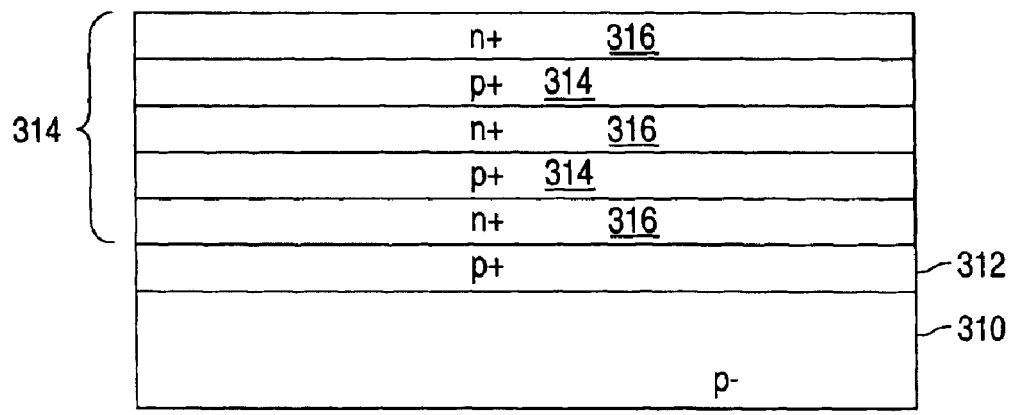

FIGS. 3A–3B show a series of cross-sectional views that illustrate an example of a method of forming a photodiode in accordance with a first alternate embodiment of the present invention. As shown in FIG. 3A, the method also utilizes a conventionally formed semiconductor material 310, such as p-single crystal silicon, and begins by implanting semiconductor material 310 with a dopant before an epitaxial layer is grown.

As shown in the FIG. 3A example, semiconductor material 310 can be implanted with a p-type dopant to form a p+ region 312 in the surface of material 310. (Additional implanted regions can also be formed in semiconductor material 310 before the epitaxial layer is grown.)

Next, as shown in FIG. 3B, an epitaxial layer 314 is grown on semiconductor material 310 in the same manner as described above except that the second gas is introduced first to form an n+ region 316 on the p+ implanted region 312 formed in semiconductor material 310. After this, the first and second gases are alternated to form p+ and n+ regions 318 and 316, respectively. Following the formation of epitaxial layer 314, the method continues as above with the formation of the p+ and n+ sinkers.

Figure 4A:
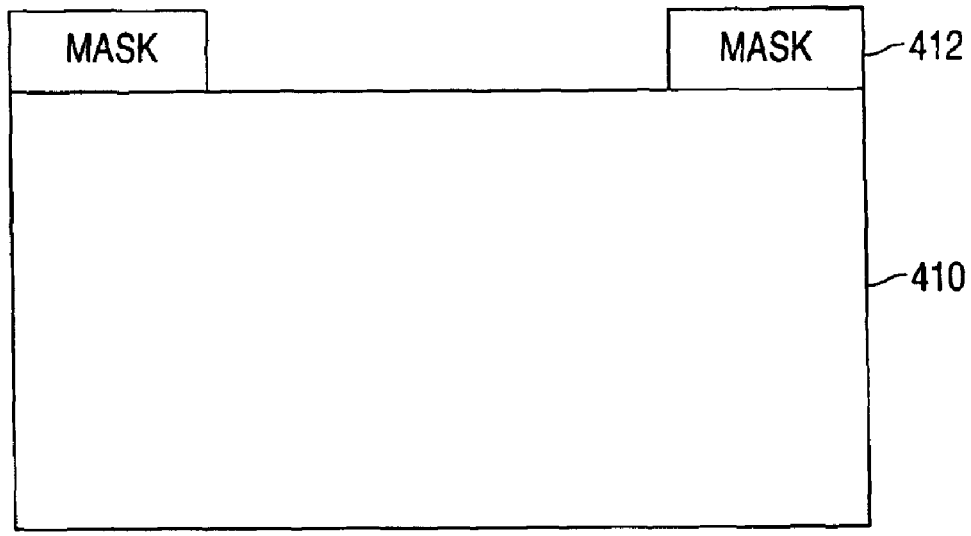
FIGS. 4A–4D are a series of cross-sectional views illustrating an example of a method of forming a photodiode in accordance with a second alternate embodiment of the present invention.

FIGS. 4A–4D show a series of cross-sectional views that illustrate an example of a method of forming a photodiode in accordance with a second alternate embodiment of the present invention. As shown in FIG. 4A, the method utilizes a conventionally formed semiconductor material 410, such as p-single crystal silicon, and begins by forming a mask 412 over semiconductor material 410.

Figure 4B:
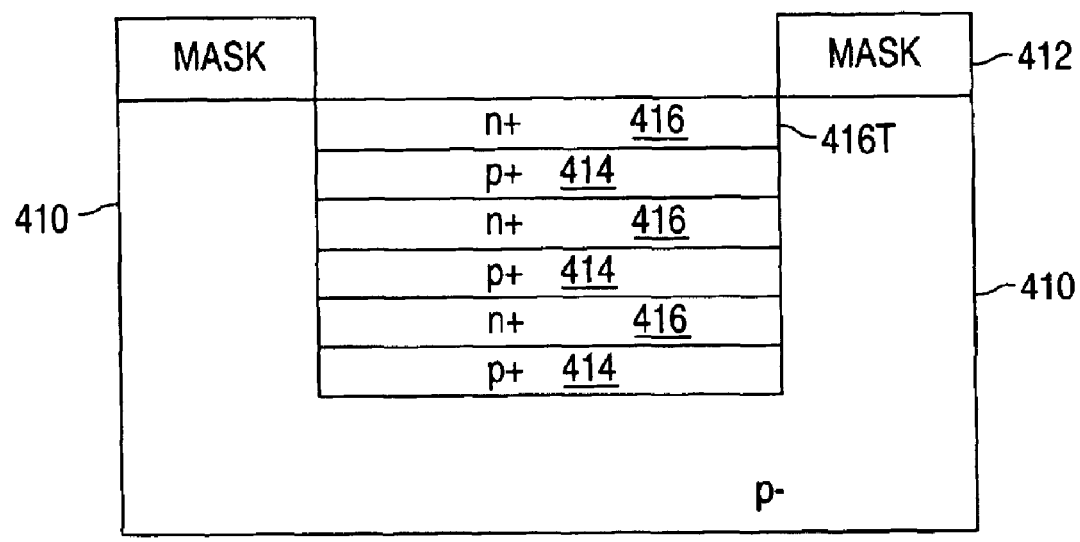

Following this, as shown in FIG. 4B, semiconductor material 410 is alternately implanted with a p-type dopant and an n-type dopant, Each time the dopant is switched, the implant energy is reduced. As a result, semiconductor material 410 is formed to have alternating p+ and n+ regions 414 and 416, respectively, with a top n+ region 416T. Mask 412 is then removed.

Figure 4C:
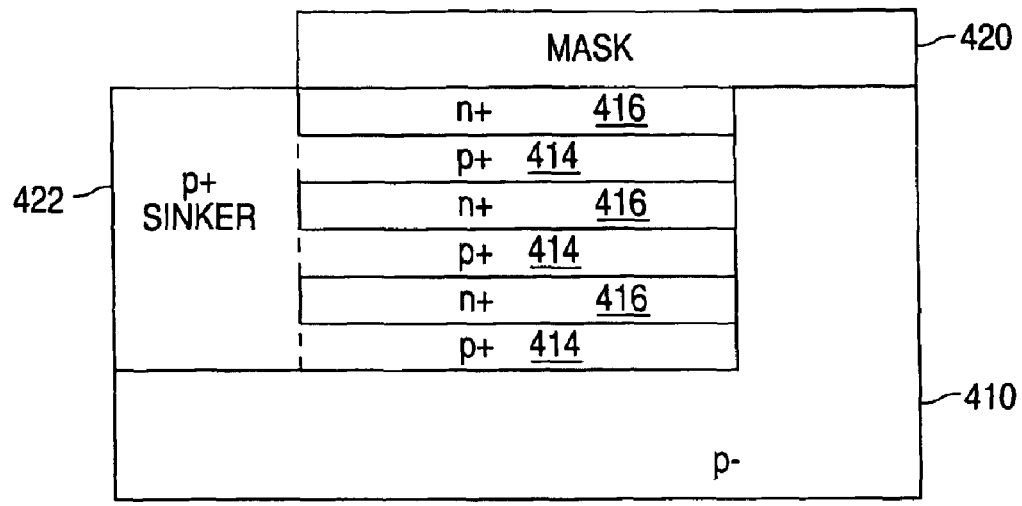

Next, as shown in FIG. 4C, a first mask 420 is formed and patterned over top n+ region 416T to expose a first region on the surface of top n+ region 416T. Following this, boron is implanted to form a p+ sinker 422 such that p+ sinker 422 contacts each p+ region 414. P+ sinker 422 has a substantially uniform dopant concentration, and can be formed using multiple implants with different implant energies. After the implant, first mask 420 is removed.

Figure 4D:
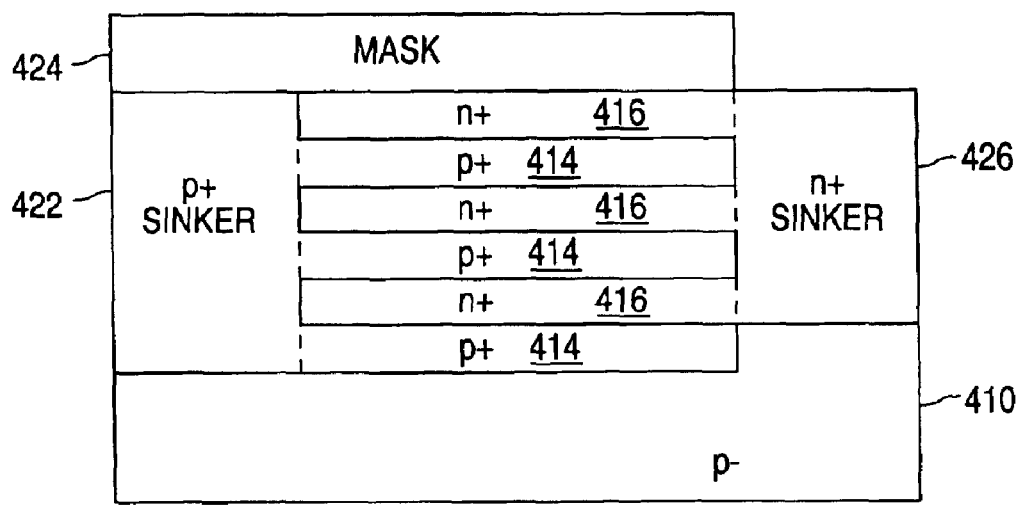

Following this, as shown in FIG. 4D, a second mask 424 is formed and patterned over top n+ region 416T to expose a second region on the surface of top n+ region 416T. Following this, an n-type material is implanted to form an n+ sinker 426 such that n+ sinker 426 contacts each n+ region 416. N+ sinker 426 has a substantially uniform dopant concentration, and can be formed using multiple implants with different implant energies. (The order of forming the p+ and n+ sinkers can be reversed.) After the implant, second mask 424 is removed and the method continues with conventional steps.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A photodiode formed in a semiconductor material, the semiconductor material having a top surface, the photodiode comprising:

a plurality of vertically spaced apart first regions of a first conductivity type formed in the semiconductor material, each first region having a dopant concentration, a first region contacting the top surface of the semiconductor material;

a plurality of vertically spaced apart second regions of a second conductivity type formed in the semiconductor material, each second region lying below and contacting a first region, and having a dopant concentration; and a first sinker of the second conductivity type formed in the semiconductor material, the first sinker contacting each second region, the first sinker having a dopant concentration that is substantially equal to the dopant concentration of a second region.

2. The photodiode of claim 1 wherein each second region has a substantially equal dopant concentration.

3. The photodiode of claim 1 and further comprising a second sinker of the first conductivity type formed in the semiconductor material, the second sinker contacting each first region.

4. The photodiode of claim 1 wherein:

each second region has a substantially uniform dopant concentration; and the first sinker has a substantially uniform dopant concentration.

5. The photodiode of claim 1 wherein a second region lies between and contacts a pair of vertically adjacent first regions.

6. The photodiode of claim 2 wherein the first and second regions are vertically aligned.

7. The photodiode of claim 3 wherein:

each second region has a substantially uniform dopant concentration;

the first sinker has a substantially uniform dopant concentration;

each first region has a substantially uniform dopant concentration;

the second sinker has a substantially uniform dopant concentration.

8. The photodiode of claim 2 wherein:

each second region has a substantially uniform dopant concentration; and the first sinker has a substantially uniform dopant concentration.

9. A photodiode formed in a semiconductor material, the photodiode comprising:

a plurality of vertically spaced apart first regions of a first conductivity type formed in the semiconductor material, each first region having a dopant concentration;

a plurality of vertically spaced apart second regions of a second conductivity type formed in the semiconductor material, each second region lying below and contacting a first region, and having a dopant concentration;

a first sinker of the second conductivity type formed in the semiconductor material, the first sinker contacting each second region, the first sinker having a dopant concentration that is substantially equal to the dopant concentration of a second region; and a second sinker of the first conductivity type formed in the semiconductor material, the second sinker contacting each first region and having a dopant concentration that is substantially equal to the dopant concentration of a first region.

10. The photodiode of claim 9 wherein:

each second region has a substantially uniform dopant concentration; and the first sinker has a substantially uniform dopant concentration.

11. A photodiode formed in a semiconductor material, the photodiode comprising:

a plurality of vertically spaced apart first regions of a first conductivity type formed in the semiconductor material, each first region having a substantially equal dopant concentration;

a plurality of vertically spaced apart second regions of a second conductivity type formed in the semiconductor material, each second region lying below and contacting a first region, and having a substantially equal dopant concentration; and a first sinker of the second conductivity type formed in the semiconductor material, the first sinker contacting each second region and having a dopant concentration substantially equal to the dopant concentration of each second region; and a second sinker of the first conductivity type formed in the semiconductor material, the second sinker contacting each first region and having a dopant concentration that is substantially equal to the dopant concentration of each first region.

12. A method of forming a photodiode, the method comprising the steps of:

forming a region of a semiconductor material, the region having a top surface, a plurality of vertically spaced apart first regions of a first conductivity type in the semiconductor material, and a plurality of vertically spaced apart second regions of a second conductivity type in the semiconductor material to form vertically alternating first and second regions, a first region contacting the top surface; and forming a first sinker of the second conductivity type in the semiconductor material, the first sinker contacting each second region, the first sinker having a dopant concentration that is substantially equal to the dopant concentration of a second region.

13. The method of claim 12 wherein each second region has a substantially equal dopant concentration.

14. The method of claim 13 wherein the step of forming first and second regions further includes the steps of:

epitaxially growing a layer of semiconductor material on the region of semiconductor material; and alternately introducing a first gas and a second gas while the layer of semiconductor material is epitaxially growing.

15. The method of claim 14 wherein the first gas introduces a dopant of the first conductivity type.

16. The method of claim 14 wherein the second gas introduces a dopant of the second conductivity type.

17. The method of claim 13 wherein the step of forming first and second regions further includes the step of alternately implanting the region of semiconductor material with a dopant of the first conductivity type and a dopant of the second conductivity type, an implant energy being reduced each time a subsequent dopant is implanted.

18. The method of claim 13 wherein:

each second region has a substantially uniform dopant concentration; and the first sinker has a substantially uniform dopant concentration.

19. The method of claim 14 and further comprising the step of forming a second sinker of the first conductivity type in the semiconductor material, the second sinker contacting each first region, wherein:

each first region has a substantially uniform dopant concentration and a substantially equal dopant concentration; and the second sinker has a substantially uniform dopant concentration.

20. The photodiode of claim 7 wherein each first region has a substantially equal dopant concentration.

21. A photodiode formed in a semiconductor material, the photodiode comprising:

three or more spaced-apart first regions of a first conductivity type formed in the semiconductor material, each first region having a dopant concentration;

three or more spaced-apart second regions of a second conductivity type formed in the semiconductor material, each second region contacting a first region and having a dopant concentration;

a third region of the first conductivity type formed in the semiconductor material, the third region contacting each first region and having a dopant concentration; and a fourth region of the second conductivity type formed in the semiconductor material, the fourth region contacting each second region and having a dopant concentration.

22. The photodiode of claim 21 and further comprising:

a layer of isolation material formed on the semiconductor material;

a first contact formed through the layer of isolation material to make an electrical connection with the third region; and a second contact formed through the layer of isolation material to make an electrical connection with the fourth region.

23. The photodiode of claim 22 wherein:

the dopant concentration of the third region is substantially equal to the dopant concentration of a first region; and the dopant concentration of the fourth region is substantially equal to the dopant concentration of a second region.

24. The photodiode of claim 23 wherein:

each first region has a substantially equal dopant concentration; and each second region has a substantially equal dopant concentration.

* * * * *

UNITED STATES PATENT AND TRADEMARK OFFICE
CERTIFICATE OF CORRECTION

| | | |
|---|---|---|
| PATENT NO. | : 7,105,373 B1 | Page 1 of 1 |
| APPLICATION NO. | : 10/640963 | |
| DATED | : September 12, 2006 | |
| INVENTOR(S) | : Hopper et al. | |

It is certified that error appears in the above-identified patent and that said Letters Patent is hereby corrected as shown below:

<u>Column 3,</u>

Line 21, delete "110" and replace with --100--.

Signed and Sealed this

Fifth Day of December, 2006

JON W. DUDAS
*Director of the United States Patent and Trademark Office*